(12) United States Patent
Kim

(10) Patent No.: US 6,194,922 B1
(45) Date of Patent: Feb. 27, 2001

(54) OUTPUT BUFFER CIRCUIT FOR SEMICONDUCTOR DEVICE

(75) Inventor: Kyung Saeng Kim, Cheongju (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/166,959

(22) Filed: Oct. 6, 1998

(30) Foreign Application Priority Data

Dec. 16, 1997 (KR) .................................................. 97/69355

(51) Int. Cl.[7] ...................................................... H03B 1/00
(52) U.S. Cl. .............................. 327/109; 327/538; 326/83
(58) Field of Search ..................................... 327/109, 108, 327/110, 111, 261, 538, 264, 284, 540, 541; 326/17, 26, 27, 28, 82–87; 323/313, 314

(56) References Cited

U.S. PATENT DOCUMENTS

| | | |
|---|---|---|
| 5,138,201 * | 8/1992 | Ohbayashi et al. ..................... 327/53 |
| 5,495,195 * | 2/1996 | Fontana et al. ....................... 327/108 |
| 5,831,465 * | 11/1998 | Watarai ................................. 327/281 |
| 5,898,315 * | 4/1999 | Knaack .................................. 326/17 |

* cited by examiner

Primary Examiner—Timothy P. Callahan
Assistant Examiner—Minh Nguyen
(74) Attorney, Agent, or Firm—Fleshner & Kim, LLP

(57) ABSTRACT

An output buffer circuit for a semiconductor device, capable of uniformly maintaining an output level regardless of an increase of a variable supply voltage VCC and improving an output speed, which includes a constant voltage generation circuit receiving the variable VCC and generating a constant voltage at a predetermined level, an inverter outputting data signals in accordance with the constant voltage outputted from the constant voltage generation circuit and first and second clock signals, a clock signal generation unit generating a third clock signal having a predetermined interval in accordance with the first clock signal and the data signals outputted from the inverter, and a pull-up transistor pulling up the output data signals of a high level at a predetermined level in accordance with the third clock signal.

11 Claims, 4 Drawing Sheets

OUTPUT BUFFER CIRCUIT FOR SEMICONDUCTOR DEVICE

BACKGROUND OF THE INVENTION

1. Field of the Invention

The present invention relates to an output buffer circuit for a semiconductor device, and in particular to an output buffer circuit capable of improving an output speed.

2. Description of the Conventional Art

FIG. 1 is a block diagram of a conventional output buffer circuit including an output control circuit 10, and inverters 11, 12, each of which is composed of a plurality of NMOS transistors.

The operation of the conventional output buffer circuit will now be described.

When the inverters 11, 12 respectively receive clock signals NU1, NU2 of a high level and clock signals ND1, ND2 of a low level, which are outputted from the output control circuit 10, the inverters 11, 12 output data signals at a high level, and when the inverters 11, 12 respectively receive clock signals NU1, NU2 at a low level and clock signals ND1, ND2 at a high level, the inverters 11, 12 output data signals at a low level.

Here, the clock signals NU1, NU2 for outputting the data signals at the high level have different roles from each other.

That is, the clock signal NU1 is applied to obtaining prompt data output, and the clock signal NU2, a delayed signal compared with the clock signal NU1, serves as a signal which maintains output of a data signal at a high level, and improves the output speed by reducing the instantaneous peak current $I_{PC}$, which is generated when the output is at a high level, as shown in FIG. 2, and therefore for reducing noise due to the peak current $I_{PC}$.

The conventional output buffer circuit maintains the high level data output which is the high level at a VCC-Vth level by employing pull-up NMOS transistors NM1, NM2, thereby reducing the amount by which the data out is charged at the high level and reducing the noise generated when the data output is transited from the high level to the low level.

However, in the conventional output buffer circuit, the output level is limited to the VCC-Vth level due to using the NMOS transistors. Therefore, when the VCC level is increased by Δv, the output level is also increased by ΔV. In result, the output level is increased in accordance with an increase in VCC, thus increasing the noise and therefore slowing down the output speed.

SUMMARY OF THE INVENTION

An object of the present invention is to provide a video signal processing apparatus that substantially obviates at least one of problems or disadvantages of the conventional art.

Another object of the present invention is to provide an output buffer circuit which is capable of uniformly maintaining an output level regardless of a variable VCC level and of improving an output speed.

An object of the present invention is to provide a constant voltage generation circuit which outputs a constant voltage at a constant level with respect to a variable VCC.

To achieve the above objects, there is provided an output buffer circuit which includes a constant voltage generation circuit receiving a variable VCC supply voltage and generating a constant voltage at a predetermined level, an inverter outputting data signals in accordance With the constant voltage outputted from the constant voltage generation circuit and first and second clock signals, a clock signal generation unit generating a third clock signal having a predetermined interval in accordance with the first clock signal and the data signals outputted from the inverter, and a pull-up transistor pulling up the output data signals of a high level at a predetermined level in accordance with the third clock signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 9A and 9B are input waveform diagrams of clock signals in the circuit of FIG. 3.

DETAILED DESCRIPTION OF THE INVENTION

Figure 1:
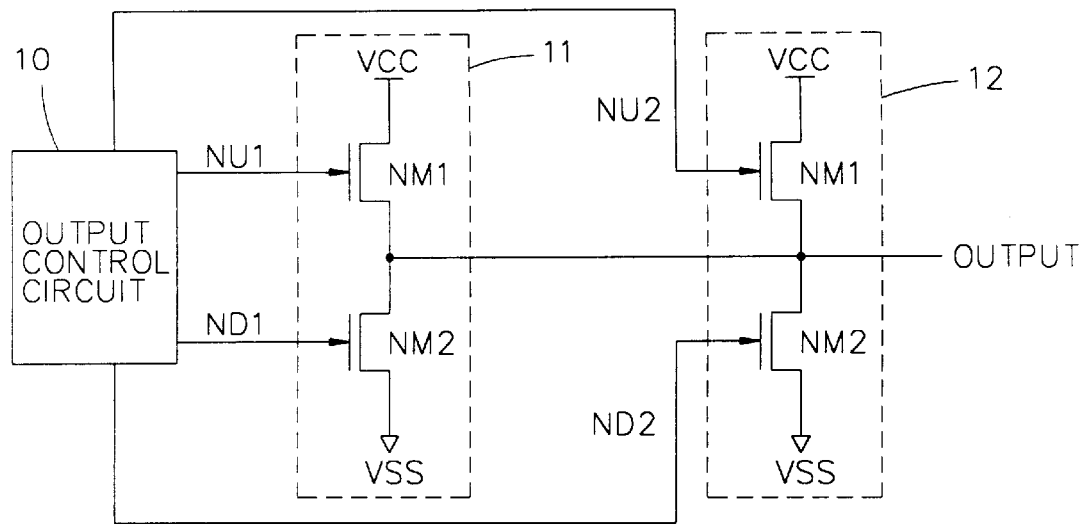
FIG. 1 is a schematic circuit diagram illustrating a conventional output buffer circuit.
Figure 2:
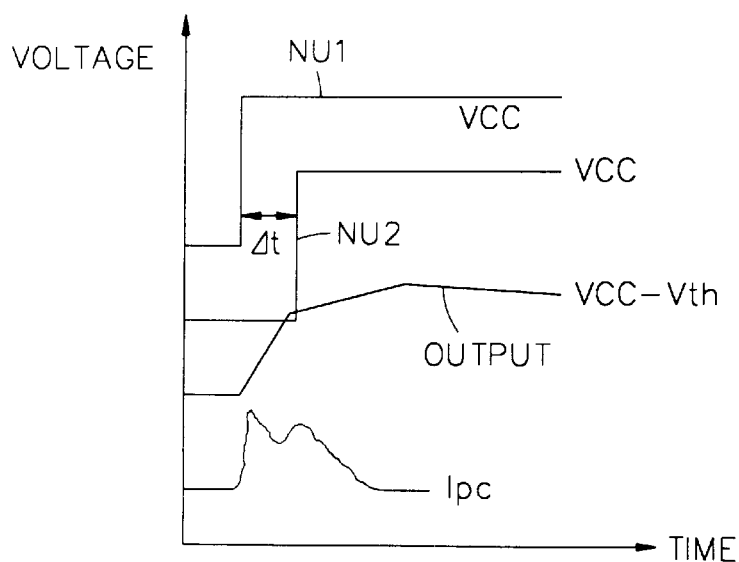
FIG. 2 a wave form diagram of the signal voltage in each unit in the circuit of FIG. 1.
Figure 3:
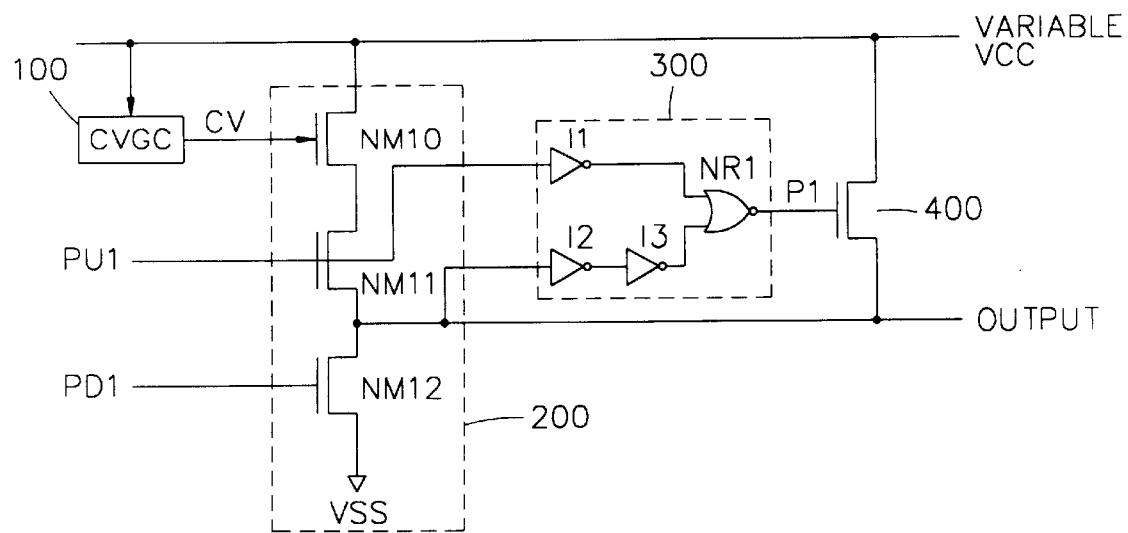
FIG. 3 is a schematic circuit diagram illustrating an output buffer circuit according to the present invention.

As shown in FIG. 3, an output buffer circuit according to the present invention includes a constant voltage generation circuit (CVGC) 100 receiving a variable supply voltage VCC and generating a constant voltage CV at a predetermined level, an inverter 200 outputting a data signal in accordance with the constant voltage CV outputted from the constant voltage generation circuit 100 and clock signals PU1, PD1, a clock signal generation unit 300 generating a clock signal P1 in accordance with the high level clock signal PU1 and the data signal outputted from the inverter 200, and a pull-up transistor 400 pulling up an high level output data signal to a predetermined level in accordance with the clock signal P1 outputted from the clock signal generation unit 300.

The inverter 200 is composed of three NMOS transistors NM10–NM12 connected in series between the variable supply voltage VCC and ground and receiving at their gates the constant voltage CV and clock signals PU1, PD1, respectively. The clock signal generation unit 300 includes an inverter I1 which inverts and delays the clock signal PU1, inverters I2, I3 sequentially delaying a signal outputted from the inverter 200, and a NOR gate NR1 NORing the output signals from the inverters I1, I3 and thus generating the clock signal P1.

Figure 4:
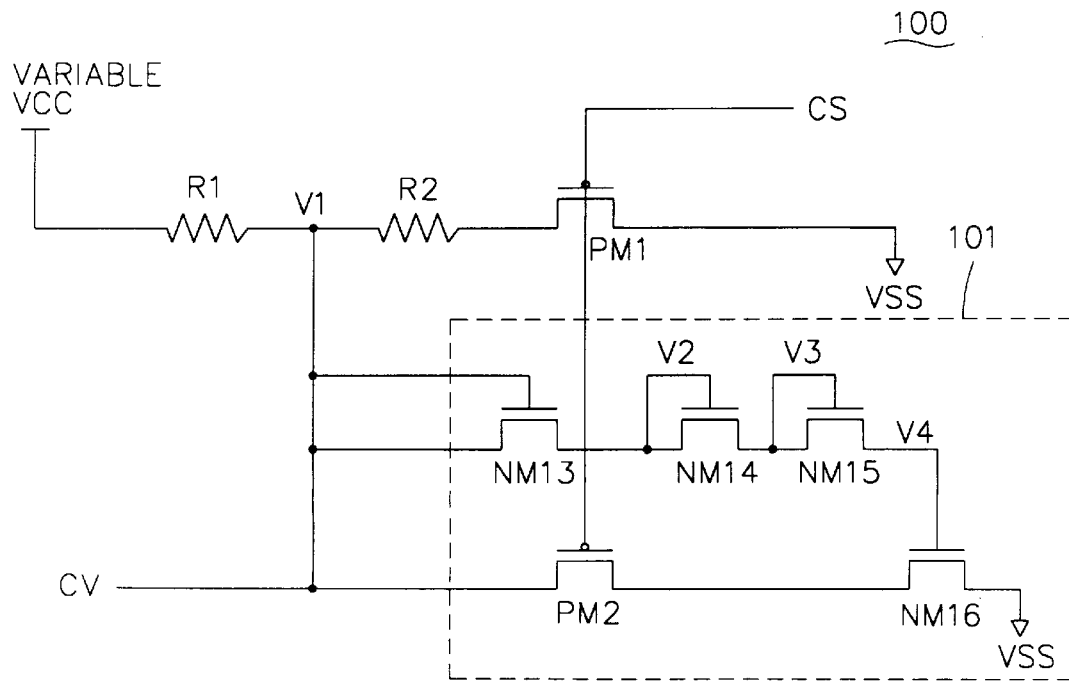
FIG. 4 is a schematic circuit diagram illustrating a first embodiment of a constant voltage generation circuit in FIG. 3.

FIG. 4 illustrates a first embodiment of a constant voltage generation circuit according to the present invention.

Resistances R1, R2 are connected in series between the variable supply voltage VCC and the channel of a PMOS transistor PM1 which is in turn connected to ground. A PMOS transistor PM2 and an NMOS transistor NM16 are serially connected between an output terminal which is also connected to a divided voltage connection point between the resistances R1, R2, and ground. A NMOS transistors NM13–NM15, each having their respective drain and gate connected together are connected in series between the divided voltage connection point of the resistances R1, R2 and a gate of the NMOS transistor NM16.

Figure 5:
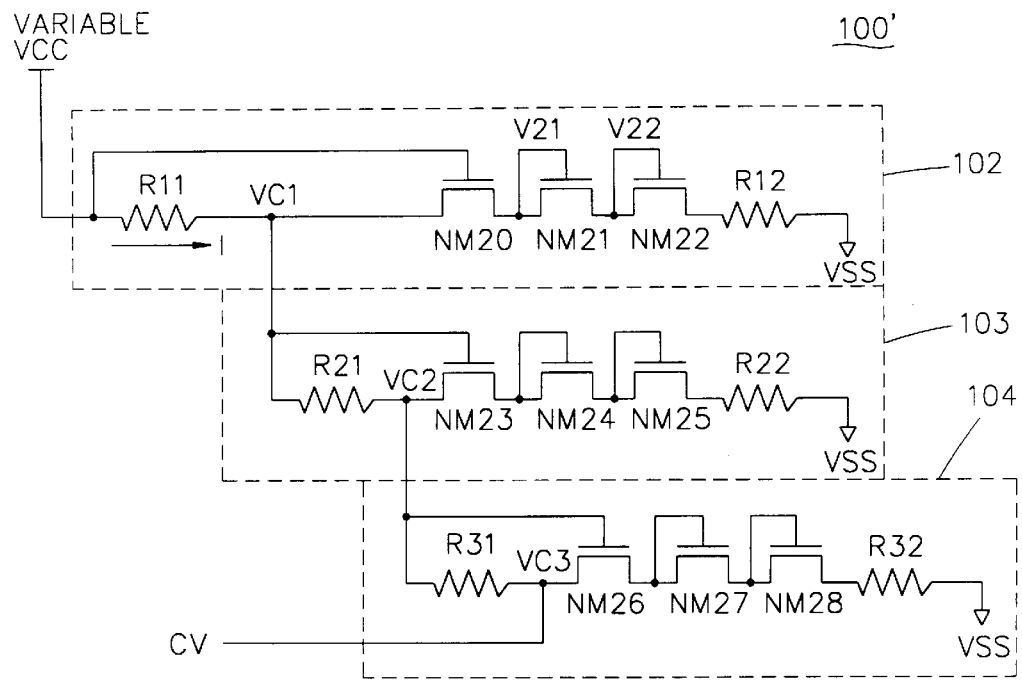
FIG. 5 is a schematic circuit diagram illustrating a second embodiment of the constant voltage generation circuit in FIG. 3.

FIG. 5 is a second embodiment of a constant voltage generation circuit according to the present invention. As shown therein, each of a plurality of cascaded unit blocks 102, 103, 104 includes a first resistance, three NMOS transistors, and a second resistance which are connected in series between the variable VCC and ground, and the divided output voltage of each unit block is inputted to the next cascaded unit block.

First, the operation of the first embodiment of the constant voltage generation circuit 100 will now be described with reference to the accompanying drawings.

Figure 6:
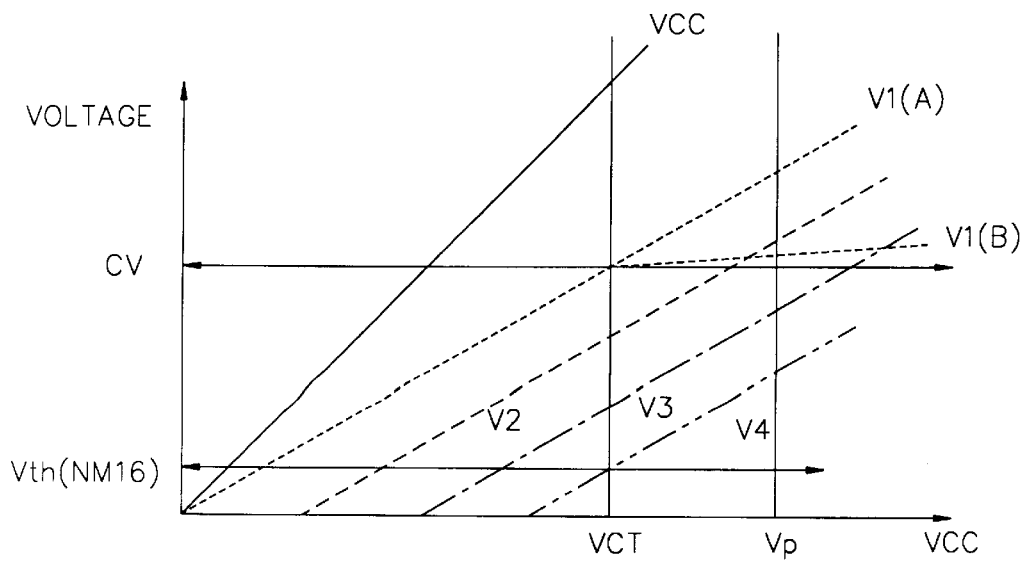
FIG. 6 a graph illustrating the output voltage of each node in the circuit of FIG. 4 under a variable VCC.

When the PMOS transistors PM1, PM2 are enabled by the control signal CS being applied to their gates at a low level, the voltage at a node V4 applied to the gate of NMOS transistor NM16 disables the block 101 until VCC reaches a VCT voltage, that is, the threshold voltage of the NMOS transistor NM16, and therefore the effective resistance between ground connected through the channel of the PMOS transistor PM1 and the node V1 is the value of R2, and thus as shown in FIG. 6, a voltage V1(A) at the node V1 is divided by the resistances R1, R2. When the VCC is continuously increased, the voltage of each of the nodes V2, V3, V4 is as shown in FIG. 6 due to the threshold voltage Vth characteristic of the NMOS transistors NM13, NM14, NM15, and when VCC becomes greater than the VCT voltage, the NMOS transistor NM16 is turned on, and therefore the effective resistance between the node V1 and ground varies.

Here, since the resistance R1 is much larger than the effective resistance of the NMOS transistor NM16, a greater voltage drop occurs across the resistance R1, and a voltage V1(B) at the node V1 which is greater than the VCT voltage maintains the constant voltage CV having a smaller variation than VCC, as shown in FIG. 6.

Next, the operation of the second embodiment of the constant voltage generation circuit 100' will now be described with reference to the accompanying drawings.

First, as VCC increases, the NMOS transistors NM20, NM21, NM22 are sequentially turned on in accordance with the level of VCC. Here, as shown in FIG. 7, when the level of VCC is less than the VCT voltage, the output voltage VC1 of the unit block 102 becomes the VCC level, and as the VCC level is greater than VCT, the NMOS transistors NM20, NM21, NM22 are all turned on, and thus a current I flows between VCC and ground.

Here, the output voltage VC1{=VCC×(R11/total equivalent resistance)} of the unit block 102 has the value of the VCC voltage divided by the ratio of the resistance R11 with respect to the total equivalent resistance between VCC and ground.

Figure 7:
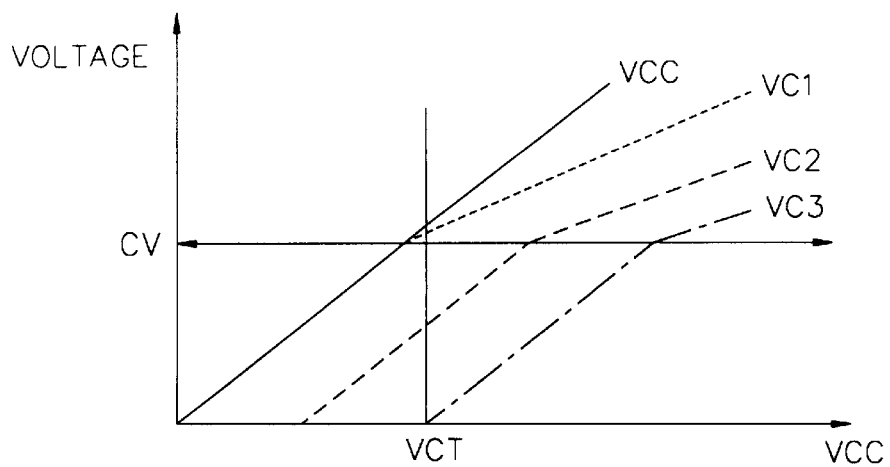
FIG. 7 is a graph illustrating the output voltage of each node in the circuit of FIG. 5 under a variable VCC.

That is, as shown in FIG. 7, when VCC becomes greater than VCT, the output voltage VC1 of the unit block 102 has a value of the variable VCC less the voltage drop I×R11 in accordance with the values of the resistance R11 and the current I, and the output voltage VC2 of the unit block 103 has a value of the output voltage VC1 of the unit block 102 less the voltage drop I×R21, and an output voltage VC3 of the unit block 104 has a value of the output voltage VC2 of the unit block 103 less the voltage drop I×R31. In result, FIG. 7 shows that each of the output voltages VC1, VC2, VC3 has only a slight increase compared with the increase in VCC.

Figure 8:
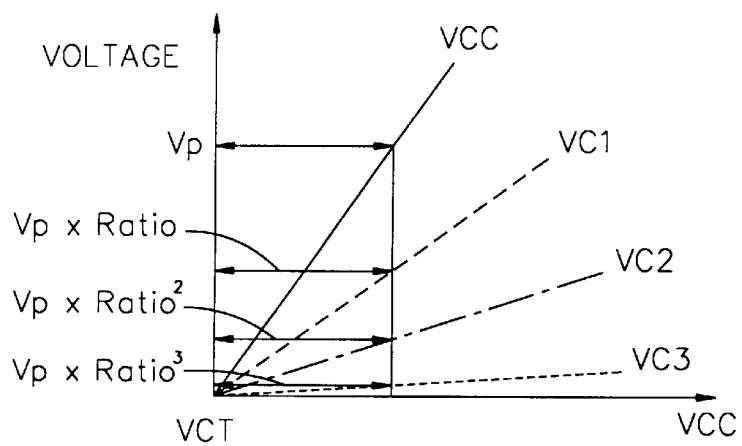
FIG. 8 is a detailed graph illustrating the output voltage of each node in FIG. 7 when the variable VCC is above a VCT level.
Figure 8:
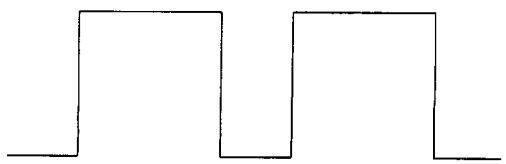
Figure 8:
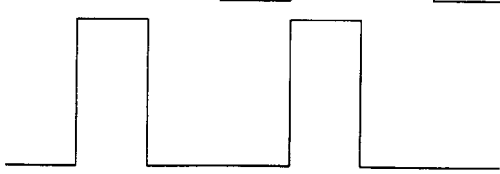

FIG. 8 illustrates the output voltages VC1, VC2, VC3 of the unit blocks 102, 103, 104, respectively, in detail when VCC becomes greater than VCT, wherein Ratio indicates the resistance ratio of the resistance R11 to the total equivalent resistance between VCC, greater than VCT, and ground, that is, Ratio=R11/the total equivalent resistance.

Accordingly, when the maximum value of VCC is Vp, the output voltages VC1, VC2, VC3 of the unit blocks 102, 103, 104 become Vp×Ratio, Vp×(Ratio)$^2$, and Vp×(Ratio)$^3$, respectively, and the output voltage VC3 becomes the constant voltage CV at a predetermined level.

Also, the first and second embodiments of the constant voltage circuit according to the present invention may substitute a transistor which is turned on instead of each of the resistances.

Namely, since the constant voltage generation circuit 100, 100', which receives the variable VCC and outputs the constant output voltage CV at the predetermined level, does not employ any capacitor, but applies the characteristics of resistance and the threshold voltage of the NMOS transistors, the circuit promptly outputs the constant voltage, and reduces the power consumption regardless of the response time.

Next, the operation of the output buffer circuit according to the present invention will be described with reference to the accompanying drawings.

The constant voltage CV outputted from the constant voltage generation circuit 100/100' turns on the NMOS transistor NM10. Here, when the constant voltage CV is greater than VCC−Vth1, CV>VCC−Vth1, wherein Vth1 is the threshold voltage of the NMOS transistor NM10, the drain voltage of the NMOS transistor NM10 becomes substantially equal to VCC, and when CV is smaller than VCC−Vth1, CV<VCC−Vth1, the drain voltage of the NMOS transistor NM10 becomes the constant voltage CV regardless of the level of VCC.

When the clock signal PU1 at a low level and the clock signal PD1 at a high level are outputted from a control circuit (not shown), the NMOS transistor NM11 becomes turned off and the NMOS transistor NM12 becomes turned on, and thus a data signal at a low level is outputted. Also, when the clock signal PU1 at a high level and the clock signal PD1 at a low level are outputted from the control circuit (not shown), the NMOS transistor NM11 becomes turned on and the NMOS transistor NM12 becomes turned off, thus a data signal at a high level is outputted.

Here, as shown in FIG. 9A, when the clock signal PU1 is transited from the high level to the low level in order to output the data signal at the high level, the pulse signal generation unit 300 generates a clock signal P1, as shown in FIG. 9B, which has a pulse interval corresponding to a delay difference between the inverter I1 and the inverters I2, I3, thereby turning on the pull-up NMOS transistor 400.

Accordingly, the output data signal is pulled up to the nominal VCC level in accordance with the turning on of pull-up NMOS transistor 400, while the clock signal P1 maintains a high level, and subsequently the clock signal P1 becomes a low level. Therefore, although the pull-up NMOS transistor 400 is turned off, the NMOS transistor NM11 is continuously turned on by the clock signal PU1 at the high level, thus maintaining the output data signal at the high level.

That is, when in accordance with the clock signal PU1 at the high level, the data output signal is enabled, the output data signal is pulled up by the pull-up NMOS transistor 400 during the high level interval of the clock signal P1, and is maintained at the high level by the NMOS transistor NM11, thus reducing noise and improving the output data speed by decreasing the current swing at the high level when VCC is increased.

However, the level of the output data signal is determined by the voltage values of the clock signal PU1 and the constant voltage CV.

That is, when the constant voltage CV is smaller than VCC−vth1, CV<VCC−Vth1, and when the high level of the clock signal PU1 is greater than CV−Vth2, wherein Vth2 is the threshold voltage of the pull-up NMOS transistor 400, the output data signal level becomes the same as the level of the constant voltage CV. Therefore, although the VCC varies, the output data signal can be maintained at a constant output level.

Also, when constant voltage CV is greater than VCC−Vth1, CV>VCC−Vth1, and when the high level of the clock signal PU1 is greater than CV−Vth2, the output data signal at the high level is maintained at the level of VCC−Vth1, and the total charge at the high level is decreased, thus reducing the noise which is generated when the output data signal at the high level is transited to the low level, and increasing the output speed.

In result, the output buffer circuit according to the present invention maintains the output level at the VCC−Vth1 or CV level regardless of an increase in the variable VCC, and improves the output speed of the data by employing the constant voltage generation circuit and the pull-up NMOS transistor in the output stage.

As described above, the output buffer circuit according to the present invention is capable of promptly outputting a constant voltage and reducing the power consumption by providing a constant voltage generation circuit which generates the constant voltage with respect to a variable supply voltage VCC which is variable, using the characteristics of the channel resistance and the threshold voltage drop of NMOS transistors.

Also, the circuit according to the present invention is capable of uniformly maintaining the level of the output data signal regardless of an increase in the VCC voltage.

Additionally, the circuit according to the present invention can reduce the noise and thus increase the output speed by decreasing the current swing at the high level when the VCC voltage is increased by using the pull-up transistor at the VCC level controlled by the clock signal when outputting the data at the high level.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. An output buffer circuit for a semiconductor device, comprising:
    a constant voltage generation circuit coupled for receiving a variable supply voltage to generate a constant voltage;
    a first inverter for coupling between the variable supply voltage and circuit ground to output a data signal in response to the constant voltage of the constant voltage generation circuit and first and second clock signals;
    a clock signal generation circuit that generates a third clock signal in accordance with the first clock signal and the data signal outputted from the first inverter; and
    a pull-up transistor for coupling between the variable supply voltage and an output terminal to pull up the output terminal to a voltage level of the variable supply voltage in accordance with the third clock signal, wherein the first inverter comprises first, second and third NMOS transistors coupled in series and receiving at respective gates thereof the constant voltage, the first clock signal, and the second clock signal.

2. The circuit of claim 1, wherein the clock signal generation circuit comprises:
    a second inverter that delays the first clock signal;
    third and fourth inverters coupled in series to sequentially delay the data signal outputted from the first inverter; and
    a logic gate that performs a logical operation on output signals outputted from the second and fourth inverters to generate the third clock signal.

3. The circuit of claim 2, wherein when the first clock signal is at a high level, the clock signal generation circuit generates the third clock signal having a pulse interval corresponding to a delay time of the fourth inverter.

4. The circuit of claim 1, wherein the data signal of the first inverter has a value of (VCC−Vth1), where Vth1 is a threshold voltage of the first NMOS transistor, when the constant voltage is greater than (VCC−Vth1) and a high level of the first clock signal is greater than (the constant voltage−Vth2), where Vth2 is a threshold voltage of the pull-up transistor.

5. The circuit of claim 1, wherein the data signal of the first inverter has a value of the constant voltage when the constant voltage is smaller than (VCC−Vth1) and a high level of the first clock signal is greater than (the constant voltage−Vth2) where Vth1 and Vth2 are threshold voltages of the first and second NMOS transistors, respectively.

6. The circuit of claim 1, wherein the constant voltage generation circuit comprises:
    first and second resistors and a first PMOS transistor coupled in series;
    a second PMOS transistor and a fourth NMOS transistor coupled in series and in parallel between a node connection of the serially coupled first and second resistors and the circuit ground; and
    a plurality of fifth NMOS transistors, each having a drain and gate thereof being commonly coupled to each other and being serially coupled between the node connection and a gate of the fourth NMOS transistor.

7. The circuit of claim 1, wherein the constant voltage generation circuit comprises a plurality of cascaded dividers, each cascaded divider having:
    a first resistor having one end thereof coupled to an output node;
    a fourth NMOS transistor having a drain thereof coupled with the output node and a gate coupled for receiving a prescribed voltage;

a plurality of fifth NMOS transistors coupled in series with a source of the fourth NMOS transistor; and a second resistor coupled to a source of a last one of the plurality of fifth NMOS transistors.

8. The circuit of claim 7, wherein at least one of the first and second resistors comprises a turned-on NMOS transistor.

9. An output buffer circuit, comprising:

a constant voltage generator that receives a variable voltage from a variable voltage supply and generates a constant voltage;

a data signal generator comprising first, second and third transistors coupled in series, coupled between the constant voltage generator, the variable voltage supply, a ground and an output terminal, said data signal generator being responsive to the constant voltage and a plurality of control signals to generate an output data signal to the output terminal, said first transistor being responsive to the constant voltage, and said second and third transistors being responsive to corresponding control signals and providing the output data signal; and a pull-up circuit coupled between the data signal generator and the output terminal to receive the output data signal generated and one of the plurality of control signals, said pull-up circuit generating a second control signal in accordance with one of the plurality of control signals and the output data signal, wherein the pull-up circuit comprises a first inverter that delays one of the plurality of control signals; a second inverter and a third inverter coupled in series to sequentially delay the output data signal, a logic gate that logically combines output signals of the first and third inverters to generate the second control signal, and a pull-up transistor having a first electrode coupled to the variable voltage supply, a second electrode coupled to the output terminal, and a control gate coupled for receiving the second control signal.

10. The circuit of claim 9, wherein the constant voltage generator comprises:

a plurality of resistors and a first PMOS transistor coupled in series;

a second PMOS transistor and a first NMOS transistor coupled in series, and in parallel between a node of the serially coupled plurality of resistors and the circuit ground; and a plurality of second NMOS transistors, each having a drain and gate thereof being commonly coupled to each other and being serially coupled between the node and a gate of the first NMOS transistor.

11. The circuit of claim 9, wherein the constant voltage generator comprises a plurality of cascaded dividers, each cascaded divider having:

a first resistor having a first end coupled to an output node;

a first transistor having a drain thereof coupled to the output node and a gate coupled for receiving a prescribed voltage;

a plurality of second transistors coupled in series with a source of the first transistor; and a second resistor coupled to a source of a last one of the plurality of second transistors.

* * * * *